United States Patent [19]

Davies

[11] Patent Number: 5,304,939
[45] Date of Patent: Apr. 19, 1994

[54] TRACKING PEAK DETECTOR

[75] Inventor: David C. Davies, Chelmsford, Mass.

[73] Assignee: Digital Equipment Corporation, Maynard, Mass.

[21] Appl. No.: 723,083

[22] Filed: Jun. 28, 1991

[51] Int. Cl.$^5$ .......................... H03K 5/153; H03K 5/08
[52] U.S. Cl. ...................................... 328/151; 307/351; 307/359
[58] Field of Search ...................... 307/358, 359, 351; 328/151

[56] References Cited

U.S. PATENT DOCUMENTS

| 3,509,371 | 4/1970 | Rice | 307/233 |
| 4,376,266 | 3/1983 | Raffoux | 307/359 |
| 4,533,844 | 8/1985 | Miller et al. | 307/530 |
| 4,605,867 | 8/1986 | Veehof | 307/351 |
| 4,686,389 | 8/1987 | Seifert | 328/151 |
| 4,751,468 | 6/1988 | Agoston | 328/133 |
| 4,814,714 | 3/1989 | Beadle | 328/151 |
| 4,866,301 | 9/1989 | Smith | 328/151 |
| 4,906,864 | 3/1990 | McCorkle | 307/351 |
| 4,987,323 | 1/1991 | Fujita | 307/351 |

FOREIGN PATENT DOCUMENTS 0085625 5/1983 Japan .................................. 328/151

OTHER PUBLICATIONS

J. W. Allen, "Amplitude Measurement Circuits" IBM Tech. Discl. Bulletin vol. 17, No. 8, Jan. 1975 pp. 2429–2430.
Q. A. Rice, "Peak detector with linear decay" New Electron. (G.B.) vol. 10, No. 22, Nov. 15, 1977 p. 43.

Primary Examiner—John Zazworsky
Attorney, Agent, or Firm—Arnold, White & Durkee

[57] ABSTRACT

A peak detector circuit employs a line receiver of the ECL type, with the analog input signal to be tracked as a receiver input. The other receiver input is connected to the circuit output. A capacitor connects the output node of the circuit to threshold reference voltage input. The capacitor is charged through a resistor from the output of the line receiver when the input signal exceeds the voltage on the output node, and the capacitor discharges to the reference input through this resistor and another resistor connecting the receiver output to the reference input. The output voltage tracks the peaks of the input signal. Oscillation of the receiver is avoided by using a threshold reference greater than zero. The dynamic range of the output can be extended to a level higher than that of ECL levels by summing the thresholds of a number of these detectors, using an operational amplifier.

12 Claims, 2 Drawing Sheets

TRACKING PEAK DETECTOR

BACKGROUND OF THE INVENTION

This invention relates to peak detector circuits, and more particularly to a tracking peak detector of the type used in communications circuits.

In communications circuits such as signal reception equipment used in local area networks or the like, it is often necessary to derive a threshold, or a number of thresholds, from a variable amplitude signal. The thresholds will change as the input signal changes. For example, in a communication channel, the length of the link can vary between installations, and thus the signal amplitude at the receiver will vary.

Various peak detector circuits have been previously described. For example, peak detector circuits are shown in U.S. Pat. Nos. 4,533,844, 4,605,867, 4,906,864, and 4,987,323. These prior circuits have been complex and expensive, have used circuit components not compatible with the integrated circuit devices typically used in high speed communications interfaces and computers, or otherwise have been less than optimum for use in the proposed environment. As used herein, a high speed communications interface sends data on the order of 100 Mbits/sec or more.

SUMMARY OF THE INVENTION

The present invention has been made in view of the above circumstances and has as an object to provide effective tracking of a peak amplitude of a high data rate signal using apparatus that is relatively simple and inexpensive in construction.

Also, it is an object of the present invention to provide apparatus for peak detection of the amplitude of a high data rate signal which is accurate and tracks the amplitude of the high data rate signal linearly.

It is another object of the present invention to provide an apparatus for peak detection of the amplitude of a high data rate signal which is preferably constructed of components that are industry standard and compatible with other components used in a communications receiver of which this circuit will form part and should be capable of being integrated into a semiconductor integrated circuit (particularly an applications specific integrated circuit using ECL or emitter-coupled logic technology, in one embodiment).

Additional objects and advantages of the invention will be set forth in part in the description which follows and in part will be obvious from the description, or may be learned by practice of the invention. The objects and advantages of the invention may be realized and obtained by means of the instrumentalities and combinations particularly pointed out in the appended claims.

To achieve the objects and in accordance with the purpose of the invention, as embodied and broadly described herein, the present invention is directed to a peak detector for detecting the peak amplitude of a high data rate signal. The peak detector comprises means for detecting the amplitude of a high data rate signal and for generating an output signal proportional to the amplitude.

In accordance with one embodiment of the invention, a peak detector circuit is preferably constructed using emitter coupled logic (ECL) circuitry. A line receiver has one input connected to the analog input signal to be tracked. The other receiver input is connected to the circuit output. A capacitor connects the output terminal of the circuit to a threshold reference voltage. The capacitor is charged through a resistor from the output of the line receiver when the input signal exceeds the voltage on the output terminal, and the capacitor discharges to the reference voltage through this resistor and another resistor connecting the receiver output to the reference voltage. The output voltage tracks the peaks of the input signal. Oscillation of the receiver is avoided when no analog input signal is present by using a threshold reference voltage greater than zero volts. The dynamic range of the output can be extended to a level higher than that of ECL levels by summing the thresholds of a number of these detectors, using an operational amplifier.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENTS

Figure 1:
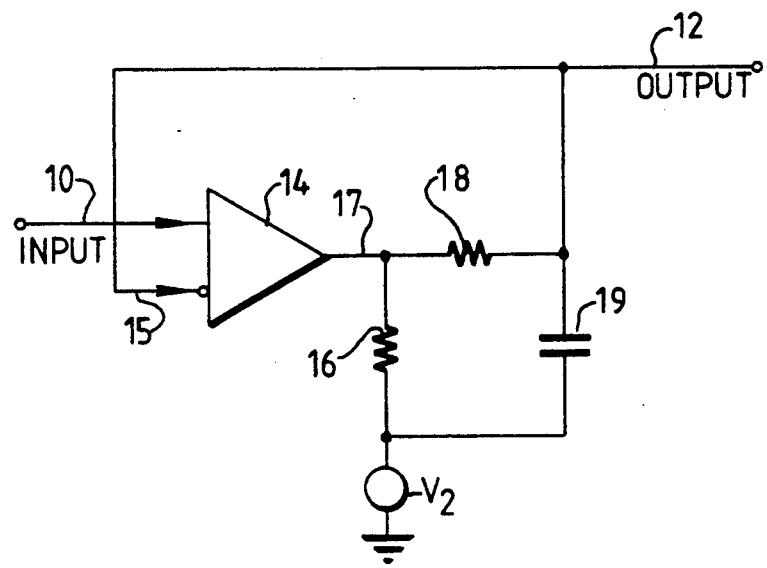
FIG. 1 is an electrical circuit diagram of a tracking peak detector circuit according to one embodiment of the invention.
Figure 2:
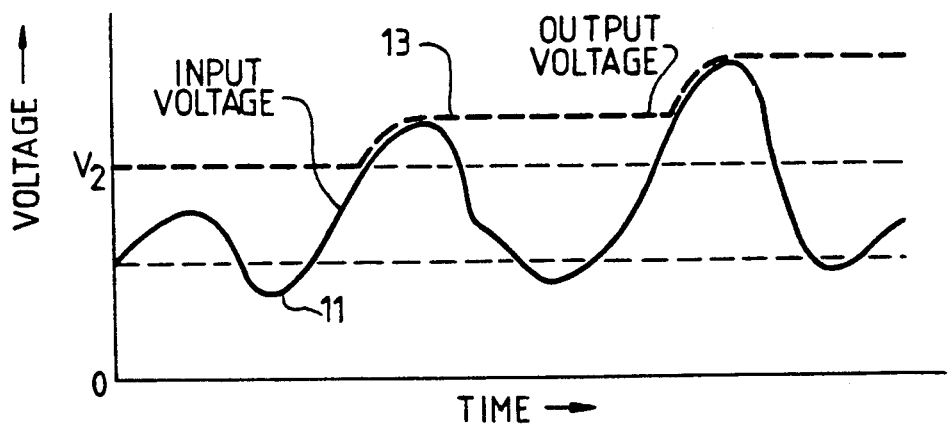
FIG. 2 is a diagram of voltage as a function of time for an example of input and output voltages in the circuit of FIG. 1.

Referring to the circuit diagram of FIG. 1 and the voltage waveforms of FIG. 2, a tracking peak detector circuit according to one embodiment of the invention has an input terminal 10 which receives an analog signal input 11. It is the signal input 11 whose peak amplitude is to be detected and provided at an output terminal 12 as a signal output 13. The input terminal 10 is connected to the non-inverting input of an ECL line receiver 14, which is a standard integrated circuit part. For example, a line receiver device commercially available from Motorola as part number MC10H116 may be used here. The other input 15 of the receiver 14 is an inverting input and is connected to the output terminal 12 which is connected to the output 17 of the receiver 14 through a resistor 18. The output terminal 12 is biased initially by a voltage source $V_2$ through a resistor 16 and the resistor 18. The voltage source $V_2$ sets a minimum threshold voltage in the circuit and ensures that no spurious oscillations can occur in the line receiver 14. Since $V_2$ is greater than zero volts, the line receiver 14 is turned off (i.e., output 17 supplies no current), because the input 15 is more positive than input terminal 10. As the signal input 11 on input terminal 10 begins to vary, the voltage on input terminal 10 will approach the voltage on the input 15, and if the input signal 11 is large enough, it will exceed the voltage on the input 15. When this happens, the receiver 14 starts to turn on and supplies current to the capacitor 19, whose voltage starts to increase. As the voltage across the capacitor 19 increases, so does the voltage at input 15, until the voltage at input 15 matches the input voltage 11 at terminal 10. At this point, the line receiver 14 turns off and the new threshold voltage is established, providing the signal output 13 of FIG. 2. Any discharge of the capacitor 19 through the resistors 16 and 18 and thus discharge of the input bias to the amplifier 14, will be compensated for at the next signal peak. There is negligible leakage through the output 17 of the receiver 14 because it exhibits a back biased diode characteristic.

Figure 3:
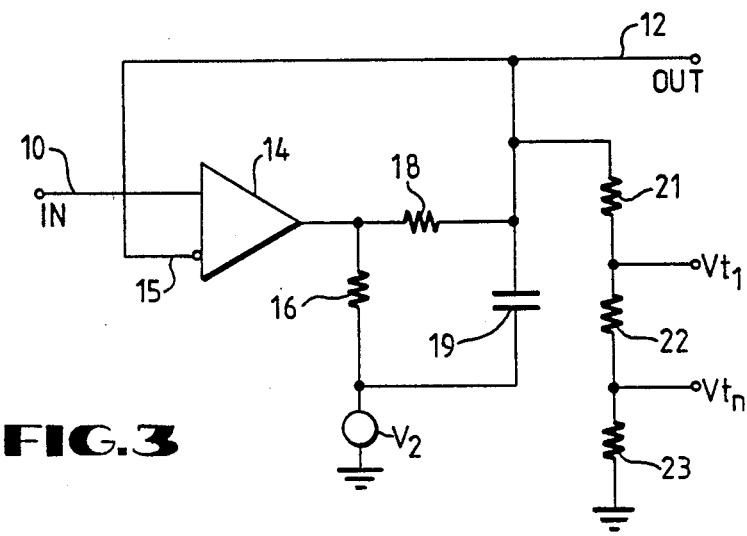
FIG. 3 is an electrical circuit diagram of a tracking peak detector circuit providing multiple output threshold voltages, according to another embodiment of the invention.

Referring to FIG. 3, multiple thresholds are provided by voltages $V_{t1}$ to $V_{tn}$ across resistors 21, 22 and 23 connected to the output terminal 12 as a voltage divider, allowing multiple threshold voltages to be derived instead of the single output voltage. This is useful in a multilevel signalling scheme. The resistors 21, 22 and 23 form no part of the operation of the peak detection, but of course provide another path for discharge of the capacitor 19 and so should be of high value compared to the resistors 16 and 18.

Figure 4:
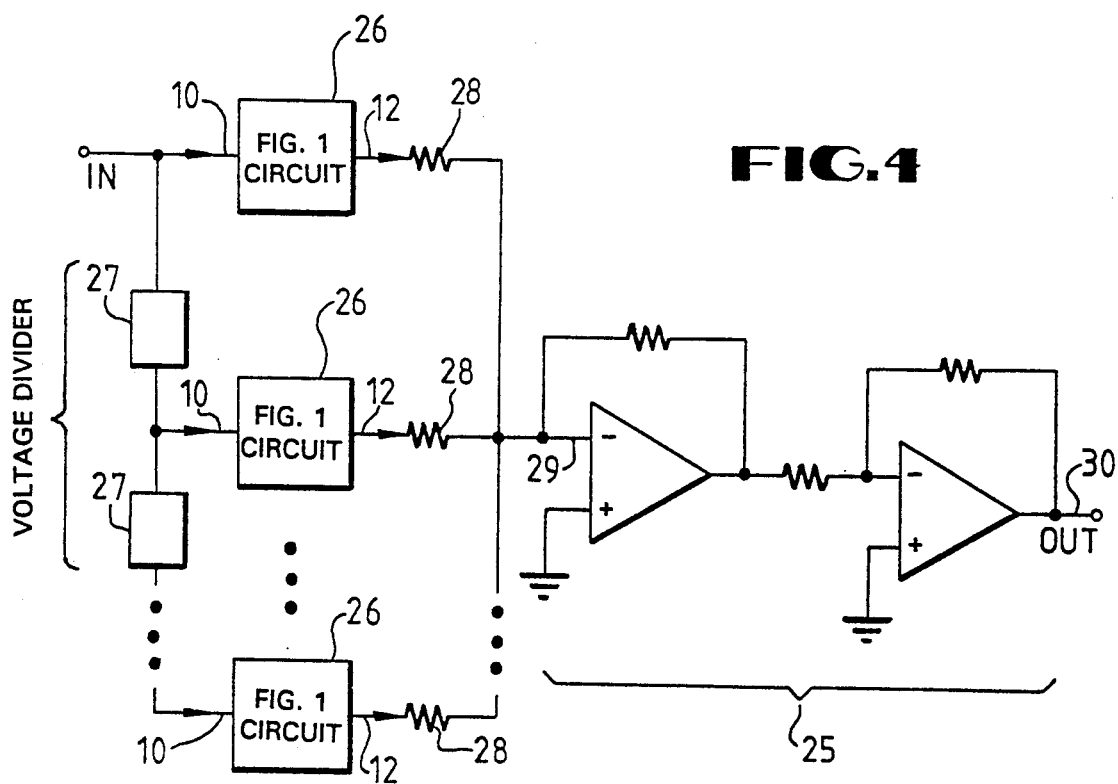
FIG. 4 is an electrical circuit diagram of a tracking peak detector circuit providing a wider dynamic range of output voltage and increased input dynamic range, according to another embodiment of the invention, using the circuit of FIG. 1.

The ECL circuitry limits the maximum output voltage to approximately 0.5 volts due to the specifications of ECL parts. The dynamic range of the peak detector, according to another embodiment of the invention, may be extended by summing thresholds as seen in FIG. 4. A two-stage operational amplifier 25 is employed. The input terminal 10 is applied to a number of tracking peak detector circuits 26, each of which is identical to the circuit of FIG. 1, using attenuators 27 (a voltage divider). The output terminals 12 are all applied through resistors 28 to an input 29 of a first stage of the operational amplifier 25, and the output of the first stage of the operational amplifier 25 is applied to the input of the second stage of the operational amplifier 25. The output terminal 30 has a greater dynamic range of voltage than a single one of the tracking peak detectors 26.

The peak detector circuit as described is simple in construction, and of low cost, since a very few components are needed and these components are of standard types. An important point is that the circuit can be constructed of components that are standard and compatible with other components used in a communications receiver or computer, and further that it is capable of being integrated into an application-specific integrated circuit device. The circuit provides a high degree of accuracy, and the threshold may be set in a positive and uncomplicated way by varying the voltage $V_2$. The output terminal 12 tracks the incoming voltage amplitude linearly. Changes due to operating voltage or temperature track changes in the ECL system, using the circuit's output voltage. The noise suppression characteristics are independent of the signal channel in the communications equipment.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A peak detector circuit comprising:
   (a) a differential amplifier having first and second inputs and an output; said first input being connected to a signal input, said second input being connected to an output node;
   (b) a capacitor connected between said output node and a reference input of non-zero voltage;
   (c) a first resistor connecting said output to said reference input of non-zero voltage;
   (d) a second resistor connecting said output to said output node.
2. A circuit according to claim 1 wherein, when a voltage on said signal input exceeds a voltage on said reference input, an output voltage is produced on said output node of greater magnitude than said voltage on said reference input and following said voltage on said signal input to a peak.
3. A circuit according to claim 1 wherein said signal input is an analog voltage input.
4. A circuit according to claim 1 including a reference voltage source connected to said reference input.
5. A circuit according to claim 4 wherein said reference voltage is a positive value greater than zero.
6. A circuit according to claim 1 including a voltage divider connected across said output node to provide a plurality of output voltages of varying levels.
7. A system including a plurality of said circuits of claim 1, each circuit of said plurality having its said signal input coupled to a signal voltage for said system and each circuit of said plurality having its said output node coupled to an input of an operational amplifier, the output of said operational amplifier providing a tracking output of greater dynamic range than that of said output nodes.
8. A circuit according to claim 1 wherein said signal input is an analog signal input, and including a reference voltage source connected to said reference input, and wherein said reference voltage is a positive value greater than zero.
9. A method of providing tracking peak detection of an input signal, comprising the steps of:
   (a) applying said input signal to one input of a differential amplifier;
   (b) applying a voltage directly from an output node to the other input of said differential amplifier;
   (c) holding said voltage on said output node on a capacitor connected directly between said output node and a non-zero reference input;
   (d) biasing an output of said differential amplifier from said non-zero reference input through a first resistor;
   (e) supplying charge to said capacitor from said output of said differential amplifier through a second resistor when said input signal exceeds the voltage on said output node.
10. A method according to claim 9 including the step of applying a reference voltage to said reference input of a positive value to provide a threshold voltage for peak detection.
11. A method according to claim 9 wherein, when said input signal exceeds a voltage on said reference input, said voltage produced on said output node is of greater magnitude than said voltage on said reference input and follows said signal input to a peak.
12. A method according to claim 10 including discharging said capacitor through said first and second resistors.

* * * * *